United States Patent
O'Leary et al.

(10) Patent No.: US 11,997,817 B2
(45) Date of Patent: May 28, 2024

(54) LOAD DISTRIBUTING FRAME FOR HEAT SINK APPLICATIONS

(71) Applicant: Ciena Corporation, Hanover, MD (US)

(72) Inventors: Mitchell O'Leary, Ottawa (CA);
Bonnie L. Mack, Carp (CA); Trevor Meunier, Kemptville (CA)

(73) Assignee: Ciena Corporation, Hanover, MD (US)

( * ) Notice: Subject to any disclaimer, the term of this patent is extended or adjusted under 35 U.S.C. 154(b) by 434 days.

(21) Appl. No.: 17/545,025

(22) Filed: Dec. 8, 2021

(65) Prior Publication Data

US 2023/0180419 A1 Jun. 8, 2023

(51) Int. Cl.
*H05K 7/14* (2006.01)

(52) U.S. Cl.
CPC .......... *H05K 7/142* (2013.01); *H05K 7/1427* (2013.01)

(58) Field of Classification Search
CPC .............................. H05K 7/142; H05K 7/1427
USPC .......................................................... 439/90
See application file for complete search history.

(56) References Cited

U.S. PATENT DOCUMENTS

| | | | | |
|---|---|---|---|---|
| 6,055,159 | A * | 4/2000 | Sun | H01L 23/4093 174/16.3 |
| 6,243,264 | B1 * | 6/2001 | Bollesen | H01L 23/4093 257/722 |
| 6,748,154 | B2 | 6/2004 | O'Leary et al. | |
| 6,831,844 | B1 | 12/2004 | Lee et al. | |
| 6,948,968 | B1 | 9/2005 | Shearman et al. | |
| 9,759,235 | B2 | 9/2017 | Saturley et al. | |
| 10,509,180 | B2 | 12/2019 | Meunier et al. | |
| 10,782,492 | B2 | 9/2020 | Meunier et al. | |
| 10,877,230 | B1 | 12/2020 | Graham et al. | |
| 10,939,536 | B1 | 3/2021 | O'Leary et al. | |
| 11,013,146 | B2 | 5/2021 | Saturley et al. | |
| 11,079,559 | B2 | 8/2021 | Leclair et al. | |
| 2005/0117305 | A1 * | 6/2005 | Ulen | H01L 23/4006 257/E23.084 |
| 2009/0311885 | A1 * | 12/2009 | Cheng | H01L 23/4093 361/679.52 |
| 2011/0110040 | A1 * | 5/2011 | Liu | H01L 23/4006 361/696 |
| 2012/0318477 | A1 * | 12/2012 | Yang | H01L 23/4006 411/401 |
| 2014/0262449 | A1 * | 9/2014 | Gektin | H01L 23/4006 29/825 |
| 2015/0233388 | A1 | 8/2015 | Saturley et al. | |
| 2017/0055354 | A1 | 2/2017 | Meunier et al. | |
| 2017/0244211 | A1 | 8/2017 | Lee et al. | |

(Continued)

*Primary Examiner* — Gary F Paumen
(74) *Attorney, Agent, or Firm* — Clements Bernard Walker; Christopher L. Bernard

(57) ABSTRACT

A sprung frame assembly that can accommodate varying tolerance device heights while still exerting sufficient pressure/force required to a heatsink to contact and cool a bare die device, or other device of the like. Adapted for space constrained modules where placement of mounting holes is limited, and module density is high. Sprung frames are secured to mounting points at available locations on support structures as to eliminate any mounting holes in the PCB. The required force/pressure can be evenly achieved by methodically tightening a plurality of screws with springs at the corners of the sprung frames in sequence, pressure is applied evenly without damaging the device, while also taking up any tolerances in the device height.

20 Claims, 8 Drawing Sheets

(56) References Cited

U.S. PATENT DOCUMENTS

| | | |
|---|---|---|
| 2018/0067274 A1 | 3/2018 | Mack |
| 2019/0045651 A1* | 2/2019 | Ehlen .................... E05B 65/006 |
| 2020/0100379 A1 | 3/2020 | O'Leary et al. |
| 2020/0388548 A1* | 12/2020 | Blackburn ............ G02B 6/4278 |
| 2020/0396825 A1* | 12/2020 | Wu .......................... G06F 1/20 |
| 2021/0112683 A1 | 4/2021 | Mohajer et al. |
| 2021/0132311 A1* | 5/2021 | Shearman ............ G02B 6/4261 |
| 2021/0136951 A1 | 5/2021 | Graham et al. |
| 2022/0336322 A1* | 10/2022 | Paavola .................. H01L 23/46 |

* cited by examiner

LOAD DISTRIBUTING FRAME FOR HEAT SINK APPLICATIONS

FIELD OF THE DISCLOSURE

The present disclosure generally relates to PCB layout and component configuration. More particularly, the present disclosure relates to systems and methods for a load distributing frame for heat sink applications.

BACKGROUND OF THE DISCLOSURE

Space management, i.e., arranging electrical and mechanical components, is a growing challenge in modern computing hardware such as storage devices and networking hardware. This challenge is due to the ever-increasing capacity and density of components in computing hardware. As described herein, components include electrical and/or optical hardware mounted on a Printed Circuit Board Assembly (PCBA). Networking, computing, and/or storage devices are formed via hardware modules which include the PCBA, and which are typically disposed within a chassis, shelf, or the like, i.e., a hardware platform. A hardware module, or simply a module, may also be referred to as a circuit pack, a line module, a blade, etc. Modules are becoming increasingly smaller with less available space within, resulting in less space on the PCBA for component layout purposes. Because of smaller modules, PCBA designs are becoming significantly more compact resulting in a much denser arrangement of components thereon. As such, the reduction of hardware required to attach components such as a heatsink mounting mechanism is highly beneficial for both the physical space and computer aided PCBA design.

BRIEF SUMMARY OF THE DISCLOSURE

In various embodiments, the present disclosure relates to a device and methods for a load distributing sprung frame assembly. When installed, the sprung frame assembly can accommodate varying tolerance device heights while still exerting sufficient pressure/force required to a heatsink to contact and cool a bare die device, or other device of the like, in space constrained modules where placement of mounting holes is limited, and module density is high. By using the sprung frames and securing them to mounting points at available locations on support structures, the required force/pressure can be evenly achieved. By methodically tightening a plurality of shoulder screws with springs at the corners of the sprung frames in sequence, pressure is applied evenly without damaging the device, while also taking up any tolerances in the device height. This allows the same parts to be used on all assemblies, and the same process, without any changes in parts or process used by an assembler/operator at a high-volume manufacturing site within such a space constrained module.

In an embodiment, a sprung frame assembly includes a first sprung frame adapted to be secured to a support structure, wherein the first sprung frame applies pressure to a device fastened to a printed circuit board (PCB); and a second sprung frame adapted to be secured to a support structure, wherein the second sprung frame supports the PCB on the opposite side of the first sprung frame and the PCB requires no holes for mounting of the first sprung frame and the second sprung frame. The first sprung frame applies pressure to a heat sink, compressing the heat sink onto the device. The support structure can include mounting points for the first and second sprung frames, wherein the mounting points are located such that the pressure applied by the first and second sprung frames is uniform and such that a plurality of elongated members of the first and second sprung frames are as short as possible to increase rigidity. The first and second sprung frames can be used with any height tolerance of the device.

The sprung frame assembly can further include screws and springs, wherein the first and second sprung frames are coupled to the support structure by way of the screws and springs such that force from the springs is transmitted to the device via the first and second sprung frames. A plurality of mounting points can be raised above the PCB to allow for higher density routing and clearance for taller components mounted to the PCB. The PCB can be in one of a networking module, computing module, and storage module In another embodiment, a sprung frame assembly includes a first sprung frame adapted to be secured to a support structure, wherein the first sprung frame applies pressure onto a device fastened to a printed circuit board (PCB); a second sprung frame adapted to be secured to the support structure, wherein the second sprung frame supports the PCB on the opposite side of the first sprung frame and the PCB requires no holes for mounting of the first sprung frame and the second sprung frame, and wherein the first and second sprung frames further include; a contact surface; a plurality of elongated members; and a plurality of bearing surfaces, wherein the bearing surfaces are disposed on ends of the elongated members, and the elongated members are elevated from the contact surface to create clearance for components mounted to the PCB.

The first sprung frame can apply pressure to a heat sink, compressing the heat sink onto the device. The support structure can include mounting points for the first and second sprung frames, wherein the mounting points are located such that the pressure applied by the first and second sprung frames is uniform and such that a plurality of elongated members of the first and second sprung frames are as short as possible to increase rigidity. The first and second sprung frames can be used with any height tolerance of the device. The sprung frame assembly can further include screws and springs, wherein the first and second sprung frames are coupled to the support structure by way of the screws and springs such that force from the springs is transmitted to the device via the first and second sprung frames. A plurality of mounting points can be raised above the PCB to allow clearance for higher density routing and taller components mounted to the PCB.

In a further embodiment, a module includes a printed circuit board (PCB) having electrical components disposed thereon; a heatsink; a device requiring a heatsink disposed onto the PCB; a support structure having mounting points disposed thereon; a first sprung frame adapted to be secured to a support structure, wherein the first sprung frame applies pressure to the device; and a second sprung frame adapted to be secured to the support structure, wherein the second sprung frame supports the PCB on the opposite side of the first sprung frame and the PCB requires no holes for the mounting of the first sprung frame and the second sprung frame. The first sprung frame can apply pressure to a heat sink, compressing the heat sink onto the device.

The support structure can include mounting points for the first and second sprung frames, wherein the mounting points are located such that the pressure applied by the first and second sprung frames is uniform and such that a plurality of elongated members of the first and second sprung frames are as short as possible to increase rigidity. The first and second sprung frames can be used with any height tolerance of the device. The module can further include screws and springs, wherein the first and second sprung frames are coupled to the support structure by way of the screws and springs such that force from the springs is transmitted to the device via the first and second sprung frames. The mounting points can be raised above the PCB to allow clearance for higher density routing and taller components mounted to the PCB. The module can be one of a networking module, computing module, and storage module.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
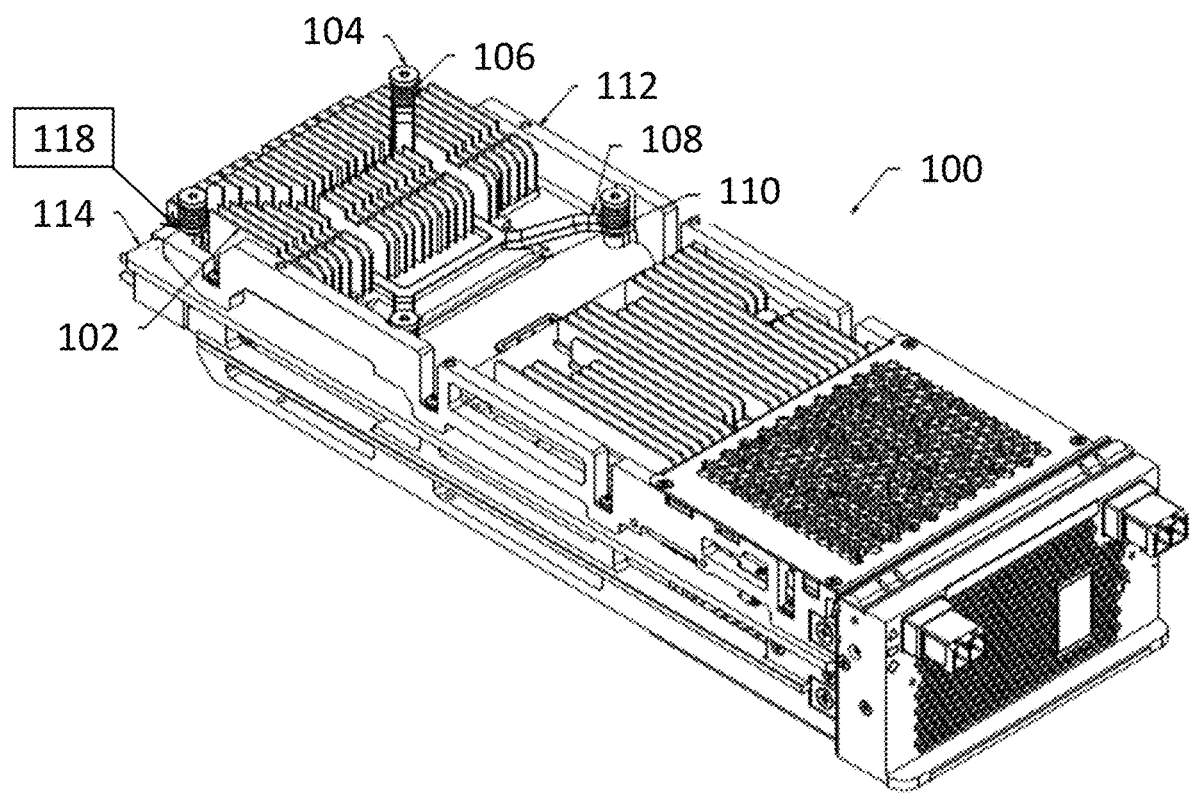
FIG. 1 is a diagram of a top surface of a hardware module, or simply a module which may also be referred to as a circuit pack, a line module, a blade, etc.

Again, in various embodiments, the present disclosure relates to a device and methods for a sprung frame assembly. When installed, the sprung frame assembly can accommodate varying tolerance device heights while still exerting sufficient pressure/force required to a heatsink to contact and cool a bare die device, or other device of the like, in space constrained modules where placement of mounting holes is limited, and module density is high. By using the sprung frames and securing them to mounting points at available locations on support structures, the required force/pressure can be evenly achieved. By methodically tightening a plurality of screws with springs at the corners of the sprung frames in sequence, pressure is applied evenly without damaging the device, while also taking up any tolerances in the device height. This allows the same parts to be used on all assemblies, and the same process, without any changes in parts or process used by an assembler/operator at a high-volume manufacturing site within such a space constrained module.

Heat sink applications to bare die devices are a common design requirement for many highly space constrained modules. Some conventional solutions in the state of the art do not scale well for mass production settings that most products such as hardware modules must endure. The known state of the art solutions that do not scale well for mass production require the use of adjustable stand offs conventionally secured with set screws, or shimmed to the correct height with any number of shims, or simply glued in place with an adhesive such as epoxy that are set and fixed during the assembly process by an installer. This way, the height in die variation is accounted for, and extra stress is not introduced to the bare die. Some solutions do make use of a sprung heatsink, as is more typically seen for enclosed devices in some products, and include a backing plate that supports the back side of the bare die device. These, however, do not fit within highly space constrained modules, where the aforementioned state of the art solutions would have worked. As a result, the present invention described herein is required to allow for heat sink securement and even pressure distribution for an open die device such as a BGA or chip carrier along with other devices of the like.

The sprung frame discussed in the present disclosure is a device designed to secure and apply force to a heatsink onto a bare die BGA (ball grid array) device soldered to a printed circuit board (PCB) within a hardware module, or simply a module, which may also be referred to as a circuit pack, a line module, a blade, etc.

Typical BGA devices have a die inside a frame as well as a cap that is secured overtop of the entire device. The cap contacts the die by way of an intermediary thermal interface material. Bare die devices are used in applications where cooling of devices is critical, and as such, removing the cap and intermediary thermal interface reduces heat losses between the die and the heat sink. The die is a high power, but mechanically very fragile component, and must have a heat sink applied in a very careful manner. The die itself can withstand and requires a high level of pressure to achieve sufficient thermal contact between itself and the heat sink. This, however, must be achieved in a very careful manner due to the fragility of the die and the variability in die heights due to manufacturing tolerances.

Traditionally, the heat sink for a bare die is attached to a bottom support plate with spring loaded screws. This requires enough space around the bare die package for mounting holes. In this application, there is insufficient space around the bare die package for mounting holes due to the condensed nature of the printed circuit board design. The signal fan out around the die does not allow for mounting holes in the narrow width of the module and even if room was found for mounting holes, they would not be in the locations required to apply even pressure on the bare die. The sprung frame assembly of the present disclosure is able to provide the pressure/force required to couple the heatsink to the bare die in a careful and compliant manner, which accounts for varying die height and considering the fragility of the bare die where there is no room to use a traditional spring mounted heatsink.

FIG. 1 is a diagram of a module 100. The module 100 may be a hardware module, which may also be referred to as a circuit pack, a line module, a blade, etc. The module 100 includes a heat sink 102 coupled to the module by way of the upper sprung frame 108 of the present disclosure. The heat sink 102 may be any conventional metallic fin heatsink or any other heatsink such as a liquid cooled heat sink or the like. The upper sprung frame 108 is adapted to couple the heat sink to a BGA device, central processing unit (CPU), or another device of the like, hereinafter referred to as a device 110. The upper sprung frame 108 is adapted to apply even and constant pressure onto the heat sink, allowing for effective contact of the heatsink to the device, resulting in adequate heat dispersion. The upper sprung frame 108 and lower sprung frame 116 (FIG. 2) will be described further herein. Note, the upper sprung frame 108 can be referred to as a first sprung frame and the lower sprung frame can be referred to as a second sprung frame.

The module 100 further includes a support structure 112 which is assembled onto a printed circuit board (PCB) 114. The support structure 112 includes a plurality of mounting points 118 on which the upper sprung frame 108 and lower sprung frame 116 are coupled. The sprung frames (108, 116) are coupled to the mounting points 118 by way of springs 104 and screws 106 in such a way as to allow the springs 104 to compress the sprung frames (108, 116) onto the heat sink 102 and/or device 110.

Figure 5:
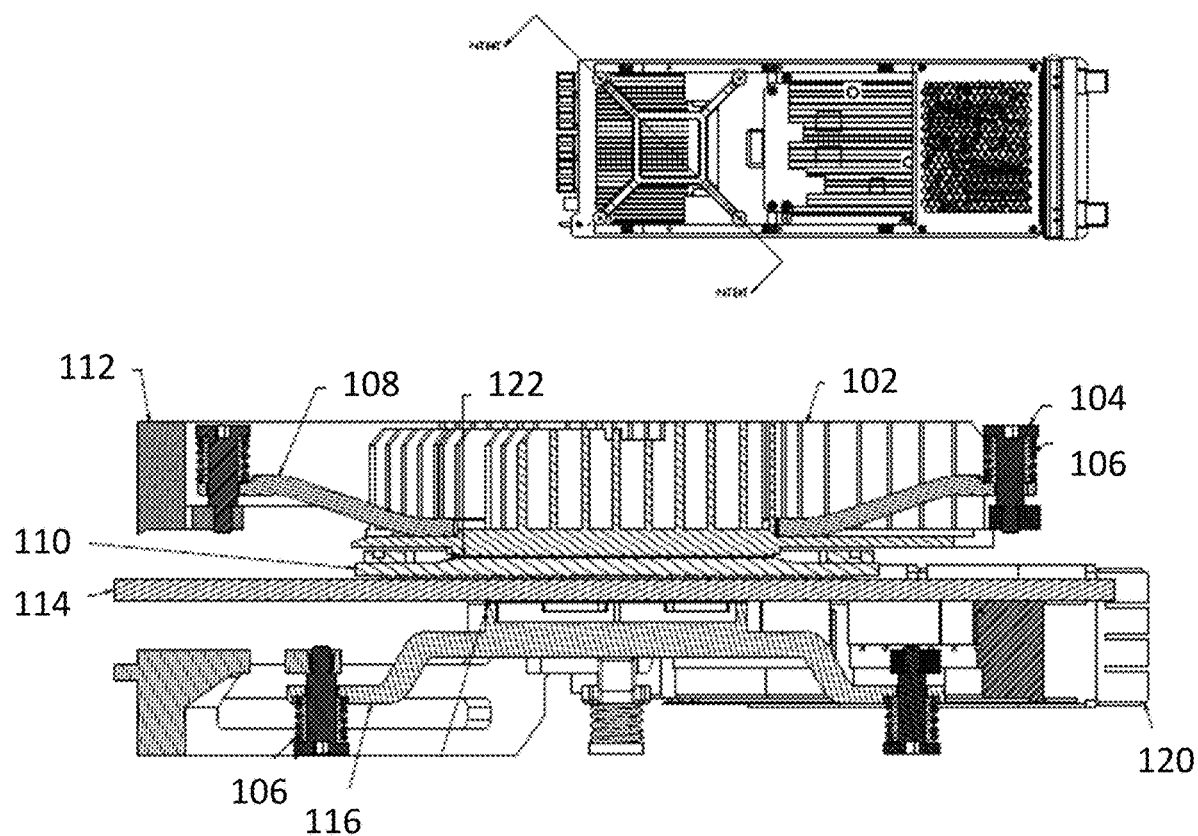
FIG. 5 is a cross section diagram of a module including a plurality of components disposed within the module.
Figure 6:
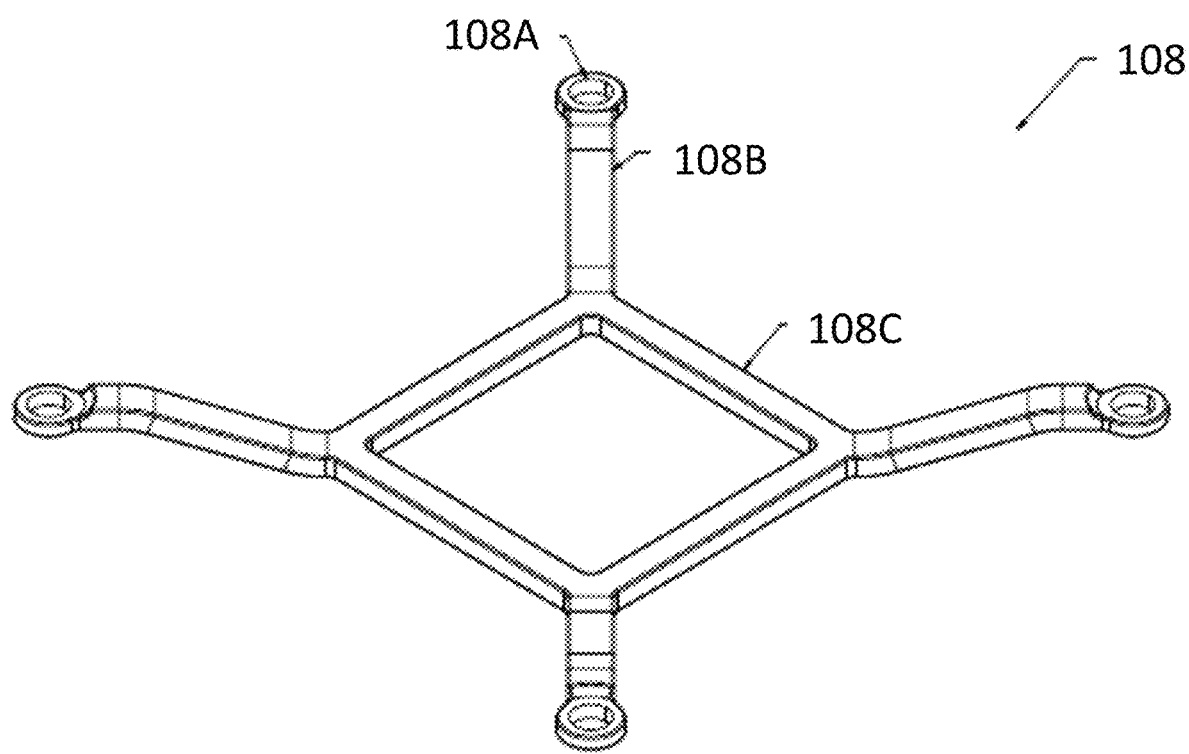
FIG. 6 is a diagram of the upper sprung frame of the present disclosure.

The upper sprung frame 108, includes mounting hole/spring bearing surfaces 108A, elongated members 108B, and a heatsink contact surface 108C (described in more detail in FIG. 6). The contact surface 108C directly interfaces with the heat sink 102, which then contacts the bare die 110B of the device 110 by way of a thermal interface material 122 (FIG. 5). Pressure is applied to the heat sink 102, by the springs 104 which are compressed by the screws 106, which are installed into the mounting points 118 in the support structure 112 which is assembled to the PCB 114.

The sprung frames (108, 116) are essential to the design as they are fundamentally a method of transmitting force from the springs 104 to the device 110 and PCB 114 within a space constrained module 100 without the need for PCB 114 mounting holes. The sprung frames (108, 116) are secured where mounting holes can be easily placed to secure the plurality of screws 106, on the existing module side rail support structure 112. The support structure 112 acts as a protective frame for the module, but as a dual purpose, the support structure 112 includes features to locate the screws 106 and mounting points 118 as close to the device 110 as practical to reduce the length of the sprung frame elongated members (108B, 116B) to make them as rigid as possible.

Figure 2:
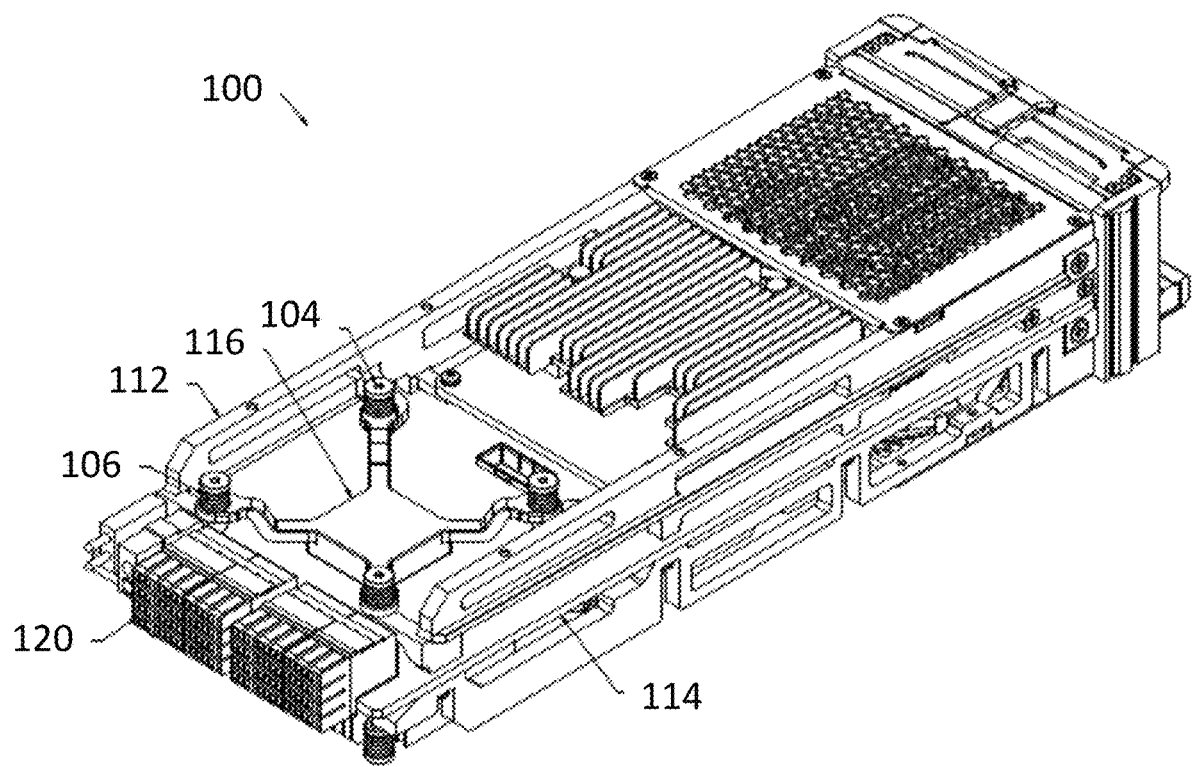
FIG. 2 is a diagram of the module illustrating a sprung frame coupled to the bottom of the module.

FIG. 2 is a diagram of the module 100 illustrating a lower sprung frame 116 coupled to the bottom of the module 100. The module 100 again includes the support structure 112 which is assembled onto a printed circuit board (PCB) 114. The support structure 112 includes a plurality of mounting points 118 on which the upper sprung frame 108 and lower sprung frame 116 are coupled. The sprung frames (108, 116) are coupled to the mounting points 118 by way of springs 104 and screws 106 in such a way as to allow the springs 104 to compress the sprung frames (108, 116) onto the heat sink 102, PCB 114, and/or device 110. The module further includes electrical connections 120 by which the module 100 may be connected to other components.

The lower sprung frame 116 includes mounting hole/spring bearing surface 116A, elongated members 116B, and a PCB contact surface 116C (FIG. 8) that supports the PCB on the opposite side of the device 110. The contact surface 116C has an insulator 124 manufactured from any nonconductive material so the metal of the frame 116 does not directly contact the PCB 114. Pressure is applied to the PCB 114, by springs 104 which are compressed by screws 106, which are installed into a support structure 112 which is assembled to the PCB 114. The purpose of the lower sprung frame 116 is to support the PCB 114 and reduce stresses on the PCB 114 and device 110 caused by the pressure/force acting on it from the upper sprung frame 108 that is needed to press on the heat sink 102 to cool the device 110.

Figure 3:
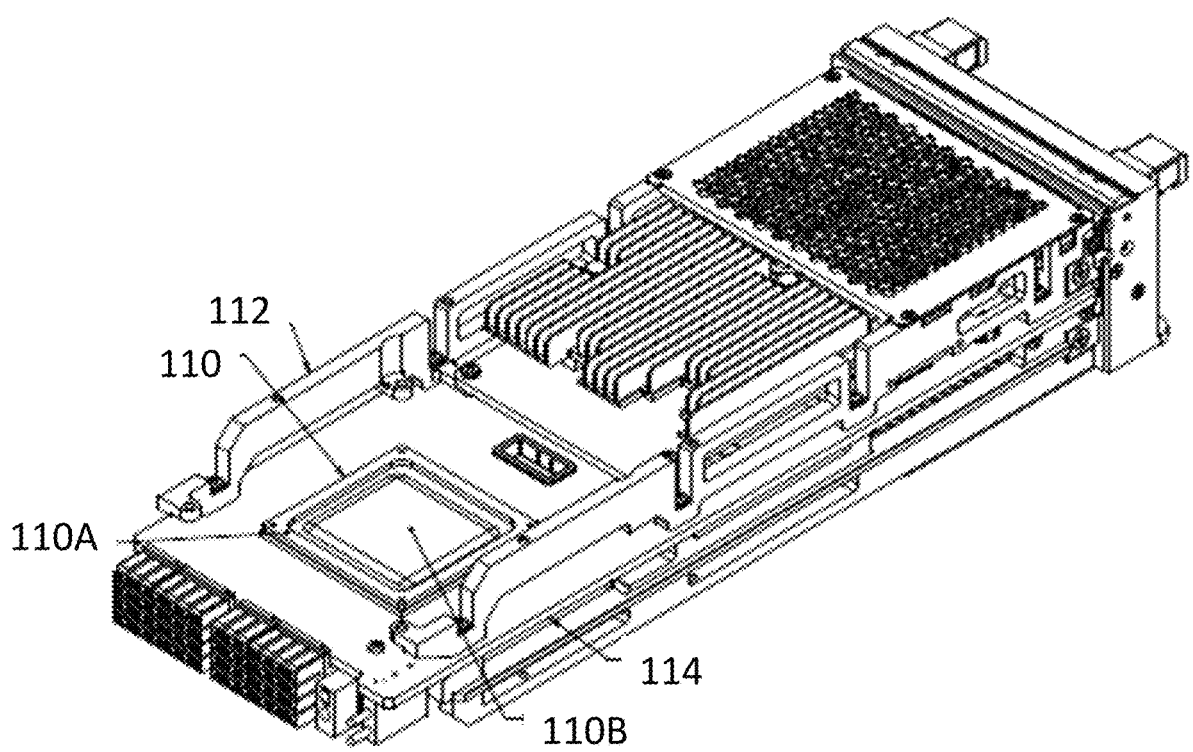
FIG. 3 is a diagram of the top surface of a module illustrating a bare die BGA (ball grid array) device.

FIG. 3 is a diagram of the top surface of a module 100 illustrating a bare die BGA (ball grid array) device 110. It will be appreciated that the BGA device of the present disclosure may be any device requiring a heat sink such as a CPU and other devices of the like. The module 100 again includes the support structure 112 which is assembled onto a printed circuit board (PCB) 114. The support structure 112 includes a plurality of mounting points 118 on which the upper sprung frame 108 and lower sprung frame 116 are coupled. In FIG. 3 the upper sprung frame 108, lower sprung frame 116, and heat sink 102 are removed to show the PCB 114 and the device 110.

Typical devices 110 include a die 110B disposed inside of a frame 110A as well as an enclosure that is secured overtop of the entire device 110. The enclosure contacts the die 110B by way of an intermediary thermal interface material. In many cases, the enclosure is removed as to expose the bare die 110B for a variety of purposes such as cooling. Bare die devices 6 are used in applications where cooling of devices 6 is critical, and as such, removing the enclosure and intermediary thermal interface material to reduce heat losses between the die 110B and the heat sink 102 results in greater thermal transfer and greater cooling. The die 110B may be a high power, but mechanically very fragile component, and must have a heat sink 102 applied in a very careful manner. The die 110B itself can both withstand and requires a high level of pressure to achieve good thermal contact between itself and the heat sink 102. This, however, must be achieved in a very careful manner due to the fragility of the die 110B and the variability in die 110B dimensions due to manufacturing tolerances.

The support structure 112 extends along the perimeter of the PCB 114, acting as both a structural support for the PCB 114 and the module 100 itself, as well as a mounting point for the upper sprung frame 108 and the lower sprung frame 116. The support structure 112 is adapted to extend along the sides of the PCB 114 as to be out of the way of any electrical components mounted to the PCB. The plurality of mounting points 118 are fixed to the support structure 112. In some embodiments, the mounting points are part of the support structure 112 itself and extend from the support structure 112. The locations of the mounting points 118 can be any location along the support structure 112 and extend in any direction and orientation from the support structure 112. It will be appreciated that the mounting points 118 may be separate structures from the support structure 112 and/or be integrated with a different member of the module 100.

Figure 4:
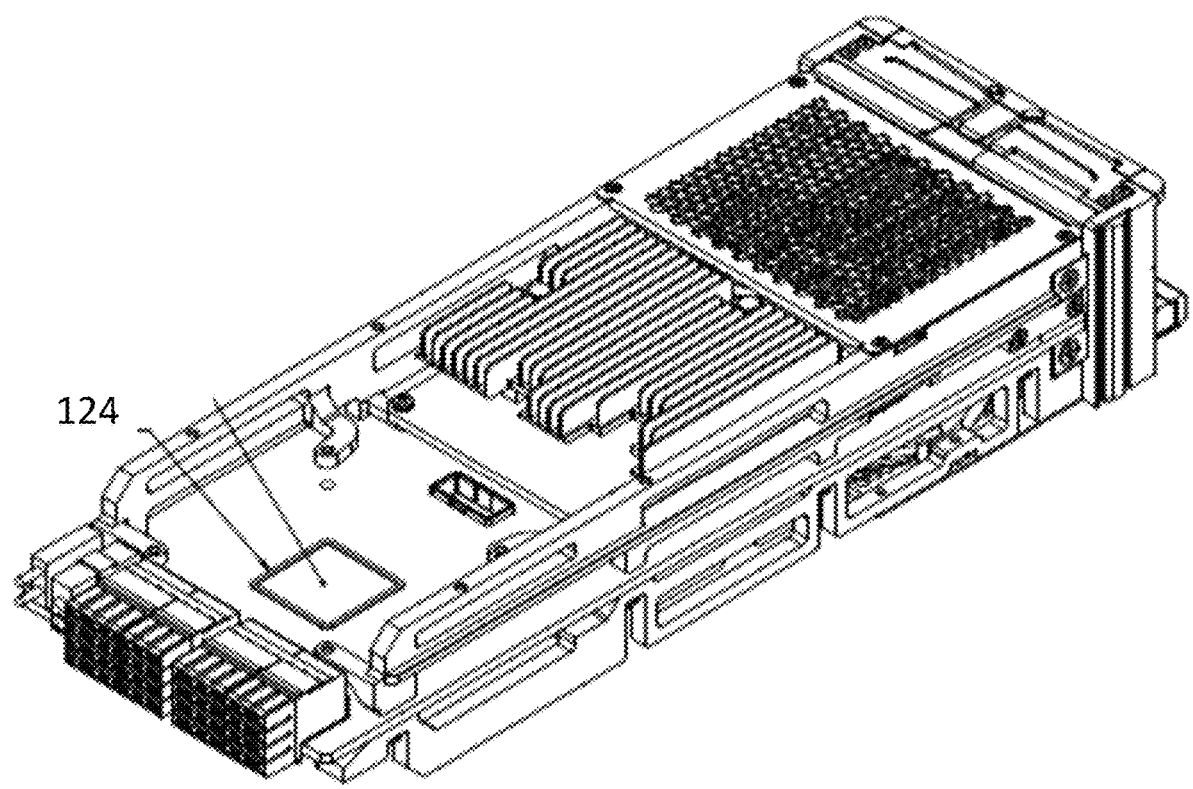
FIG. 4 is a diagram of the bottom surface of a module illustrating components disposed on a Printed circuit board assembly (PCBA).

FIG. 4 is a diagram of the bottom of a module 100 illustrating components disposed on a PCB 114. The support structure 112 extends along the bottom surface of the PCB 114, thus acting as a structural support as well as a mounting point for the lower sprung frame 116. FIG. 4 illustrates the module 100 with the lower sprung frame 116 removed to show the PCB 114 and the plurality of mounting points 118.

Again, in some embodiments, the support structure 112 is adapted to extend along the sides of the PCB 114 as to be out of the way of any electrical components mounted to the PCB 114. The plurality of mounting points 118 are fixed to the support structure 112. In some embodiments, the mounting points are part of the support structure 112 itself and extend from the support structure 112. The locations of the mounting points 118 can be any location along the support structure 112 and extend in any direction and orientation from the support structure 112. It will be appreciated that the mounting points 118 may be separate structures from the support structure 112 and/or be integrated with a different member of the module 100.

FIG. 5 is a cross section diagram of a module 100 including a plurality of components disposed within the module 100. These components again including the support structure 112 which is assembled onto a printed circuit board (PCB) 114. The support structure 112 includes a plurality of mounting points 118 on which the upper sprung frame 108 and lower sprung frame 116 are coupled. The sprung frames (108, 116) are coupled to the mounting points 118 by way of springs 104 and screws 106 in such a way as to allow the springs 104 to compress the sprung frames (108, 116) onto the PCB 114, heat sink 102, and/or device 110. A plurality of electrical connections 120 are fixed to the module to allow the module to be connected to various electrical systems such as computers, servers, and others of the like.

The module 100 further includes a thermal interface material 122 disposed between the heat sink 102 and the device 110. The thermal interface material 122 ensures sufficient thermal exchange between the components allowing the heat sink 102 to work efficiently. The sprung frames (108, 116) can be seen extending away from the surface of the PCB 114 as to allow for clearance for components disposed on the PCB 114. The absence of mounting holes on the PCB 114 to mount the heat sink 102 allows for more space for electrical components as is required in modern PCB design because of the constantly increasing density of modules. Traditionally, the heat sink for a device 110 is attached to a bottom support plate on the opposite side of the PCB 114 with spring loaded screws. This requires enough space around the device 110 for mounting holes disposed through the PCB 114. In many applications, there is insufficient space around the device 110 for mounting holes due to the condensed nature of the PCB 114 design. The upper and lower sprung frame assembly (108, 116) is able to provide the pressure/force required to couple the heat sink 102 to the device 110 in an effective and compliant manner, which accounts for varying device 110 height and taking into account the fragility of the device 110 in applications where the device 110 may be a bare die device, and where there is no room to use a traditional spring mounted heatsink.

The present disclosure provides an apparatus and method of securing a heat sink 102 to a device 110 in a controlled manner that does not damage the device 110 on a space constrained PCB 114 where a traditional spring mounted heatsink cannot be used due to the density of components disposed on the PCB 114. No holes are added to the PCB 114 around the device 110 in order to secure a heat sink 102. As a result, there are no layout restrictions for high-speed routing to and from the device 110 due to mechanical mounting holes being present. There are a sufficient number of optimally placed mounting points 118 for the sprung frames (108, 116) such that the pressure applied by the frames (108, 116) is uniform as the mounting holes are not limited or restricted by PCB 114 layout requirements. Mounting points 118 can be located exactly where needed on the dual-purpose support structure 112. The module support structures 7 are dual purpose, as they support the module 100 during insertion, as well as acting as a mounting point 118 for the sprung frames (108, 116) and the springs 104 and screws 106. The module frame support structures 7 act as the mounting location for the sprung frames (108, 116) allowing the mounting points 118 for the screws 106 and springs 104 to be raised higher in the "Z" axis (away from the PCB) above the PCB 114 to get the mechanical components up and away from the PCB 114 surface, freeing area on the layout for taller PCB mounted components. With the mounting points 118 being positioned away from the PCB 114, the PCB 114 will have less interruptions in the routing around the device 110, allowing for higher density of track routing around the device 110, shorter routing paths, less complicated routing around the device 110, and other benefits of the like. This would not be possible with a typical heat sink mounting method due to mounting holes being placed in the PCB 114. The present method of securing the heat sink 102 to the device 110 provides a way that the same components (sprung frames (108, 116), springs 104, screws 106, etc.) can be used with any height tolerance of the same device 110 for different assemblies of the same module 100 in a high-volume production manufacturing environment.

FIG. 6 is a diagram of the upper sprung frame 108 of the present disclosure. The present embodiment provides a frame 108 including elongated members 108B extending from a contact surface 108C. The contact surface includes a frame like structure, being hollow in the center to secure a heat sink 102 in compression. The elongated members 108B include bearing surfaces 108A disposed on the ends of the elongated members 108B as to allow the upper sprung frame member to be coupled to a module by way of screws 106 and springs 104.

The upper sprung frame 108, which consists of mounting hole/spring bearing surface 108A, elongated members 108B, and a heatsink contact surface 108C is adapted to provide even pressure on the heat sink 102 and device 110. The contact surface 108C directly interfaces with the heat sink 102, which then contacts the bare die 110B of the device 110 by way of a thermal interface material 122. Pressure is applied to the heat sink 102, by springs 104 which are compressed by screws 106, which are installed into a support structure 112 which is assembled to the PCB 114. Again, in some embodiments, the mounting points 118 are part of the support structure 112 itself and extend from the support structure 112. The locations of the mounting points 118 can be any location along the support structure 112 and extend in any direction and orientation from the support structure 112. It will be appreciated that the mounting points 118 may be separate structures from the support structure 112 and/or be integrated with a different member of the module 100.

The elongated members 108B extend up and away from the contact surface 108C, allowing room for electrical components disposed on the PCB 114. Because of the elongated members 108B extending away from the contact surface 108C, and the bearing surfaces 108A being coupled to the support structure 112 of the module 100, there are no mounting points on the PCB 114, thus freeing up valuable space for components. It will be appreciated that the upper sprung frame 108 of the present disclosure may be any shape which allows bearing and securement to a support structure which is not the PCB 114 itself, while providing pressure to a heat sink 102 or any heat dissipating device such as a water-cooling block or the like. The upper sprung frame 108 of the present disclosure shall be construed as a non-limiting example.

Figure 7:
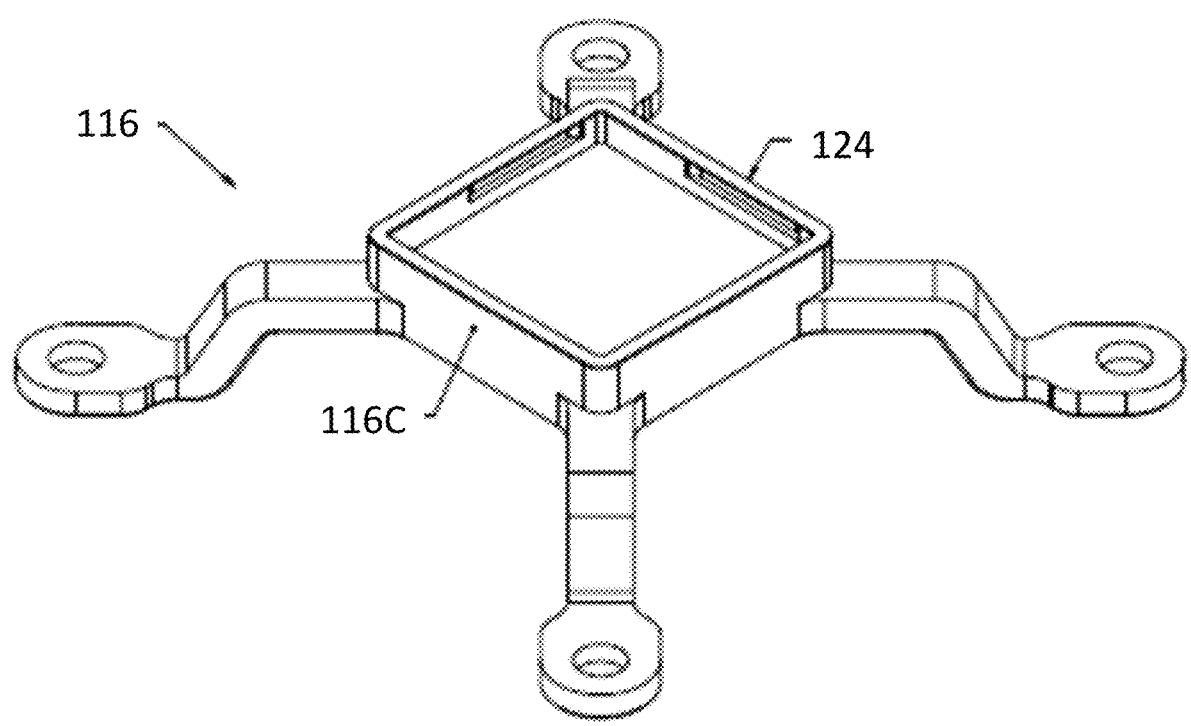
FIG. 7 is a diagram illustrating a top view of the lower sprung frame of the present disclosure.

FIG. 7 is a diagram illustrating a bottom view of the lower sprung frame 116 of the present disclosure. The present embodiment provides a frame 116 including elongated members 116B extending from a contact surface 116C. The contact surface includes a frame like structure, bearing on the PCB to provide support. The elongated members 116B include bearing surfaces 116A disposed on the ends of the elongated members 116B as to allow the lower sprung frame 116 to be coupled to a module by way of screws 106 and springs 104.

The lower sprung frame 116, which consists of mounting hole/spring bearing surface 116A, elongated members 116B, and a PCB contact surface 116C, supports the PCB on the opposite side of the bare die device 110. The contact surface 116C has an insulator 124 which may be manufactured from any nonconductive material so the metal of the frame 9 does not directly contact the PCB 114. Pressure is applied to the PCB 114, by springs 104 which are compressed by screws 106, which are installed into a support structure 112 which is assembled to the PCB 114. Again, in some embodiments, similar to the upper sprung frame 108, the mounting points 118 for the lower sprung frame 116 are part of the support structure 112 itself and extend from the support structure 112. The locations of the mounting points 118 can be any location along the support structure 112 and extend in any direction and orientation from the support structure 112. It will be appreciated that the mounting points 118 may be separate structures from the support structure 112 and/or be integrated with a different member of the module 100. The purpose of the lower sprung frame 116 is to support the device 110, in the present embodiment a bare die device, and reduce stresses in the PCB 114 and bare die device 110 cause by the pressure/force acting on it from the upper sprung frame 108 that is needed to press on the heat sink 102 to cool the device 110.

The elongated members 116B extend up and away from the contact surface 116C, allowing room for electrical components disposed on the PCB 114 similar to the upper sprung frame 108. Because of the elongated members 116B extending away from the contact surface 116C, and the bearing surfaces 116A being coupled to the support structure 112 of the module 100, there are no mounting points on the PCB 114, thus freeing up valuable space for components and eliminating any holes in the PCB 114 needed to secure the upper and lower sprung frames (108, 116). It will be appreciated that the lower sprung frame 116 of the present disclosure may be any shape which allows bearing and securement to a support structure which is not the PCB 114 itself, while providing support to the PCB 114. The lower sprung frame 116 of the present disclosure shall be construed as a non-limiting example.

The sprung frames (108, 116) are essential to the design as they are fundamentally a method of transmitting force from the springs 104 to the device 110 and PCB 114 but doing so within a space constrained module 100 without any space for PCB 114 mounting holes. The sprung frames (108, 116) are secured where mounting points 118 can be easily placed to secure the screws 106, on the existing module side rail support structure 112. The support structure 112 act as a protective frame for the module, but as a dual purpose they have features to locate the screw 106 mounting points 118 as close to the device 110 as practical to reduce the length of the elongated members (108B, 116B) to make them as rigid as possible.

Figure 8:
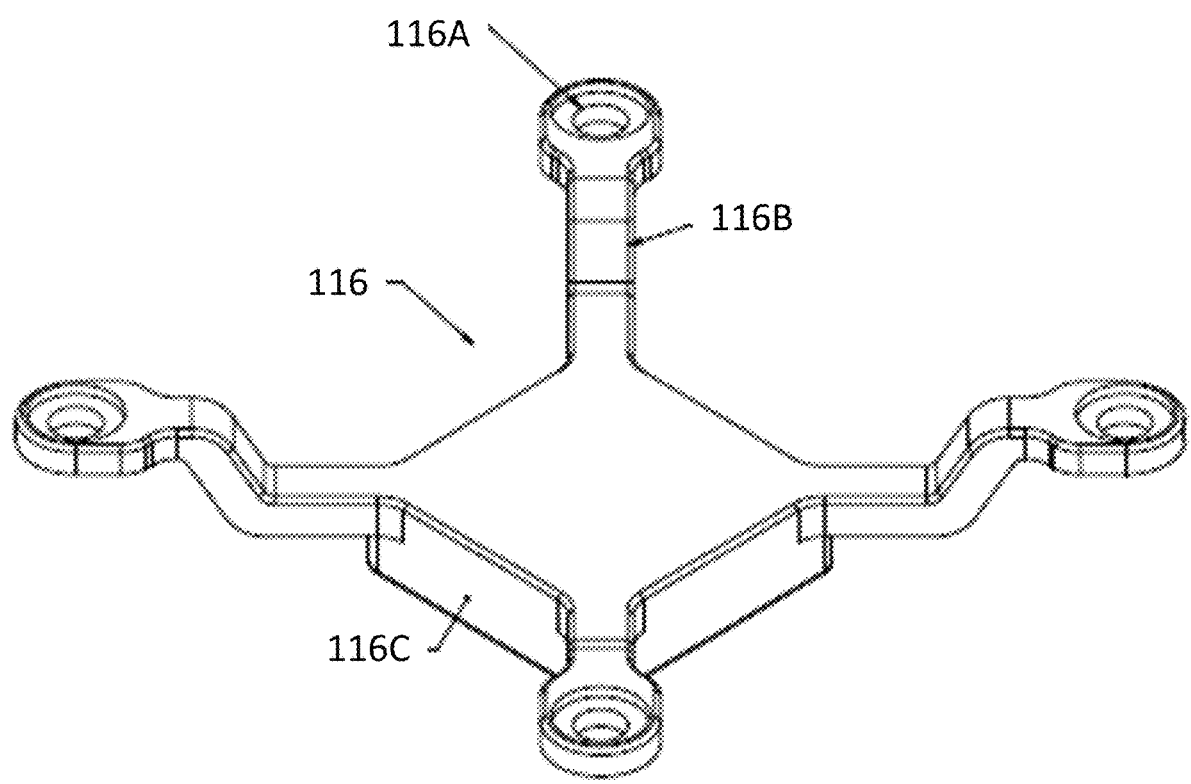
FIG. 8 is a diagram illustrating a bottom view of the lower sprung frame of the present disclosure.

FIG. 8 is a diagram illustrating a bottom view of the lower sprung frame 116 of the present disclosure. The structure of the elongated members 116B and bearing surfaces 116A can be seen more clearly. The elongated members 116B extend away from the contact surface 116C to allow clearance over the PCB 114 for components mounted thereon. The bearing surfaces 116A are adapted to couple to the support structure 112 via screws 106 and springs 104.

Note, as described herein, directional terms such as upper and lower are meant to indicate a relationship between components and not necessarily exact locations. Also, these components can be referred to as a first component, a second component, etc.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A sprung frame assembly comprising:
a first sprung frame adapted to be secured to a support structure, wherein the first sprung frame applies pressure to a device fastened to a printed circuit board (PCB); and
a second sprung frame adapted to be secured to the support structure, wherein the second sprung frame supports the PCB on the opposite side of the first sprung frame and the PCB requires no holes for mounting of the first sprung frame and the second sprung frame.

2. The sprung frame assembly of claim 1, wherein the first sprung frame applies pressure to a heat sink, compressing the heat sink onto the device.

3. The sprung frame assembly of claim 1, wherein the support structure includes mounting points for the first and second sprung frames, wherein the mounting points are located such that the pressure applied by the first and second sprung frames is uniform and such that a plurality of elongated members of the first and second sprung frames are as short as possible to increase rigidity.

4. The sprung frame assembly of claim 1, wherein the first and second sprung frames can be used with any height tolerance of the device.

5. The sprung frame assembly of claim 1, further including screws and springs, wherein the first and second sprung frames are coupled to the support structure by way of the screws and springs such that force from the springs is transmitted to the device via the first and second sprung frames.

6. The sprung frame assembly of claim 1, wherein a plurality of mounting points are raised above the PCB to allow for higher density routing and clearance for taller components mounted to the PCB.

7. The sprung frame assembly of claim 1, wherein the PCB is in one of a networking module, computing module, and storage module.

8. A sprung frame assembly comprising:
a first sprung frame adapted to be secured to a support structure, wherein the first sprung frame applies pressure onto a device fastened to a printed circuit board (PCB);
a second sprung frame adapted to be secured to the support structure, wherein the second sprung frame supports the PCB on the opposite side of the first sprung frame and the PCB requires no holes for mounting of the first sprung frame and the second sprung frame, and wherein the first and second sprung frames further include;
a contact surface;
a plurality of elongated members; and
a plurality of bearing surfaces, wherein the bearing surfaces are disposed on ends of the elongated members, and the elongated members are elevated from the contact surface to create clearance for components mounted to the PCB.

9. The sprung frame assembly of claim 8, wherein the first sprung frame applies pressure to a heat sink, compressing the heat sink onto the device.

10. The sprung frame assembly of claim 8, wherein the support structure includes mounting points for the first and second sprung frames, wherein the mounting points are located such that the pressure applied by the first and second sprung frames is uniform and such that a plurality of elongated members of the first and second sprung frames are as short as possible to increase rigidity.

11. The sprung frame assembly of claim 8, wherein the first and second sprung frames can be used with any height tolerance of the device.

12. The sprung frame assembly of claim 8, further including screws and springs, wherein the first and second sprung frames are coupled to the support structure by way of the screws and springs such that force from the springs is transmitted to the device via the first and second sprung frames.

13. The sprung frame assembly of claim 8, wherein a plurality of mounting points are raised above the PCB to allow clearance for higher density routing and taller components mounted to the PCB.

14. A module comprising:
- a printed circuit board (PCB) having electrical components disposed thereon;
- a heatsink;
- a device requiring the heatsink disposed onto the PCB;
- a support structure having mounting points disposed thereon;
- a first sprung frame adapted to be secured to the support structure, wherein the first sprung frame applies pressure to the device; and
- a second sprung frame adapted to be secured to the support structure, wherein the second sprung frame supports the PCB on the opposite side of the first sprung frame and the PCB requires no holes for the mounting of the first sprung frame and the second sprung frame.

15. The module of claim 14, wherein the first sprung frame applies pressure to a heat sink, compressing the heat sink onto the device.

16. The module of claim 14, wherein the support structure includes mounting points for the first and second sprung frames, wherein the mounting points are located such that the pressure applied by the first and second sprung frames is uniform and such that a plurality of elongated members of the first and second sprung frames are as short as possible to increase rigidity.

17. The module of claim 14, wherein the first and second sprung frames can be used with any height tolerance of the device.

18. The module of claim 14, further including screws and springs, wherein the first and second sprung frames are coupled to the support structure by way of the screws and springs such that force from the springs is transmitted to the device via the first and second sprung frames.

19. The module of claim 14, wherein the mounting points are raised above the PCB to allow clearance for higher density routing and taller components mounted to the PCB.

20. The module of claim 14, wherein the module is one of a networking module, computing module, and storage module.

* * * * *